(12) United States Patent
Kang et al.

(10) Patent No.: US 11,099,424 B2
(45) Date of Patent: Aug. 24, 2021

(54) HIGH COLOR GAMUT LED BAR WITH SIDE ILLUMINATION LED PACKAGE

(71) Applicant: Dell Products L.P., Round Rock, TX (US)

(72) Inventors: Yong Gu Kang, Singapore (SG); Guentaek Oh, Singapore (SG)

(73) Assignee: Dell Products L.P., Round Rock, TX (US)

( * ) Notice: Subject to any disclaimer, the term of this patent is extended or adjusted under 35 U.S.C. 154(b) by 62 days.

(21) Appl. No.: 16/459,979

(22) Filed: Jul. 2, 2019

(65) Prior Publication Data

US 2021/0003886 A1    Jan. 7, 2021

(51) Int. Cl.
*G02F 1/13357*    (2006.01)
*H01L 33/06*    (2010.01)

(52) U.S. Cl.
CPC ........ *G02F 1/133603* (2013.01); *H01L 33/06* (2013.01)

(58) Field of Classification Search
CPC .... H01L 33/02; H01L 33/06; G02F 1/133603
USPC ........................................................ 362/97.3
See application file for complete search history.

(56) References Cited

U.S. PATENT DOCUMENTS

| 10,134,962 B2 | 11/2018 | Fan | |
|---|---|---|---|
| 2010/0237375 A1* | 9/2010 | Yamazaki | H01L 33/507 257/98 |
| 2013/0020929 A1* | 1/2013 | van de Ven | H01J 1/63 313/498 |
| 2016/0104825 A1 | 4/2016 | Sato | |
| 2017/0194535 A1* | 7/2017 | Park | H01L 33/56 |

FOREIGN PATENT DOCUMENTS

KR    20120018490 A    3/2012

* cited by examiner

*Primary Examiner* — Christopher M Raabe
(74) *Attorney, Agent, or Firm* — Zagorin Cave LLP; Robert W. Holland

(57) ABSTRACT

An illumination device provides illumination as backlight to a liquid crystal display by disposing plural light emitting diode packages on a circuit board having green quantum dot material integrated with a photoresist ink. Each package includes one or more blue light emitting diode integrated circuits enclosed in a silicon filling material that integrates a red phosphor extending above one or more sidewalls of the package so that at least some illumination from the blue light emitting diode is directed towards the green quantum dot material, resulting in generation of high color gamut backlight illumination.

20 Claims, 5 Drawing Sheets

HIGH COLOR GAMUT LED BAR WITH SIDE ILLUMINATION LED PACKAGE

BACKGROUND OF THE INVENTION

Field of the Invention

The present invention relates in general to the field of information handling system displays, and more particularly to an information handling system high color gamut LED bar with side illumination LED package.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems typically output information as visual images generated at a display, such as a liquid crystal display (LCD). LCDs illuminate a flat panel of liquid crystal pixels from behind with a backlight to generate visual images by changing how the liquid crystal pixels pass through illumination of the backlight. Typically, each pixel includes red, green and blue liquid crystals that each change their state in response to an electrical charge to adjust the amount of red, green and blue light that passes through. The liquid crystal states are adjusted by a timing controller that scans through an array of pixel values received from a graphics processor of an information handling system. By adjusting the amount of red, green and blue light that passes through each pixel of an array, colors are generated with the combination of light so that an array of pixels define a visual image at the flat panel.

One factor that determines the quality of a visual image presented by an LCD panel is the quality of the backlight that passes through the pixels. Conventional backlights attempted to generate a white light, such as with cold cathode fluorescent lights (CCFL) or light emitting diodes (LED). Generally, LED backlights integrate plural LED packages in a bar that feeds illumination into a light guide for distribution to the LCD panel. Although such white light sources appear white to the human eye, many white light sources are a combination of light colors across the spectral spectrum. In a backlight that illuminates red, green and blue liquid crystal pixels, light energy outside of the filter effects of the liquid crystal pixels is essentially wasted.

One technique to provide white light concentrated in relevant frequencies is to generate a white backlight from the red, blue and green frequencies filtered by the liquid crystal pixels. A blue LED backlight generates blue light in the relevant blue frequency that a light guide distributes across the backside of an LCD panel. The blue light passes through a quantum dot (QD) film that includes red and green quantum dots disposed in a transparent film. The quantum dots absorb blue light and emit red and green light so that a white light results from the QD film with a red, green and blue high color gamut spectrum. The white light is vertically polarized and passed through the liquid crystal panel so that visual images are generated as the liquid crystal states filter the white light. Another technique is to integrate green and red quantum dot material within an LED package itself that includes blue LED integrated circuits so that each LED outputs white illumination.

Disposing a QD film above a blue LED light source has a number of disadvantages. For instance, the QD film increases cost and manufacturing complexity with increased thickness of the backlight structure. As another example, the use of only blue LEDs to generate illumination tends to create blue light leakage along the perimeter of the backlight structure where blue illumination does not mix with other colors due to the edge of the QD film. Leakage of blue light along the perimeter is typically addressed by increased bezel sizes at the display perimeter to define a boundary that includes overlap of the QD film. Generally, end users prefer the visual quality of high color gamut spectrum backlights in narrow bezel systems. Including green and red QD material in the LED package addresses the blue LED leakage, however, such LED packages tend to have low reliability and lifespan.

SUMMARY OF THE INVENTION

Therefore, a need has arisen for a system and method which provides high color gamut spectrum backlight directly from an LED package.

In accordance with the present invention, a system and method are provided which substantially reduce the disadvantages and problems associated with previous methods and systems for providing high color gamut spectrum backlight at a display panel. A light emitting diode (LED) package has filling material that extends over sidewalls of the package to illuminate a circuit board supporting the package. Blue light from the LED interacts with red phosphor integrated in the filling material and green quantum dot material integrated at the circuit board surface to generate high color gamut illumination.

More specifically, an information handling system processes information with a processor and memory to generate output for presentation as visual images at a display. The display illuminates the visual images with a backlight that directs illumination from a linear configuration of light emitting diodes (LED) packages disposed on a circuit board through a light guide for distribution at the display. Each LED package includes one or more blue LED integrated circuits disposed in an interior defined by sidewalls that contain a silicon filling material that integrates a red phosphor. The silicon filling material extends higher than the sidewalls relative to the circuit board so that light from the LED integrated circuits is directed towards the circuit board. In one example embodiment, the LED package has opposing ends that have a lower height relative to the circuit board than the LED integrated circuits. Green quantum dot material integrates with a photoresist ink on the circuit board to energize with illumination provided by the LED integrated circuits at the package sidewalls so that a high color gamut spectrum illumination is provided at the backlight.

The present invention provides a number of important technical advantages. One example of an important technical advantage is that a high color gamut spectrum backlight is provided with illumination from blue LED integrated circuits that excite red and green illumination materials by distributing the green material to a circuit board supporting the package. Silicon material disposed in the package includes red material and extends over sidewalls of the package to help direct illumination towards the green material. Lowered sidewalls of the package aid in directing illumination towards the circuit board, such as by having sidewalls at opposing ends of the package at a height lower than the integrated circuit that generates the blue light. As a result, red, green and blue light are generated at a common height without the use of a film disposed over the package, which reduces the risk that blue illumination will leak at the edges of the light source, such as can happen with narrow bezel displays. Further, improved reliability and lifespan are provided compared with QD LEDs that include red and green quantum dot materials inside of the LED package.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An information handling system display presents visual images illuminated by a high color gamut spectrum LED illumination device. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
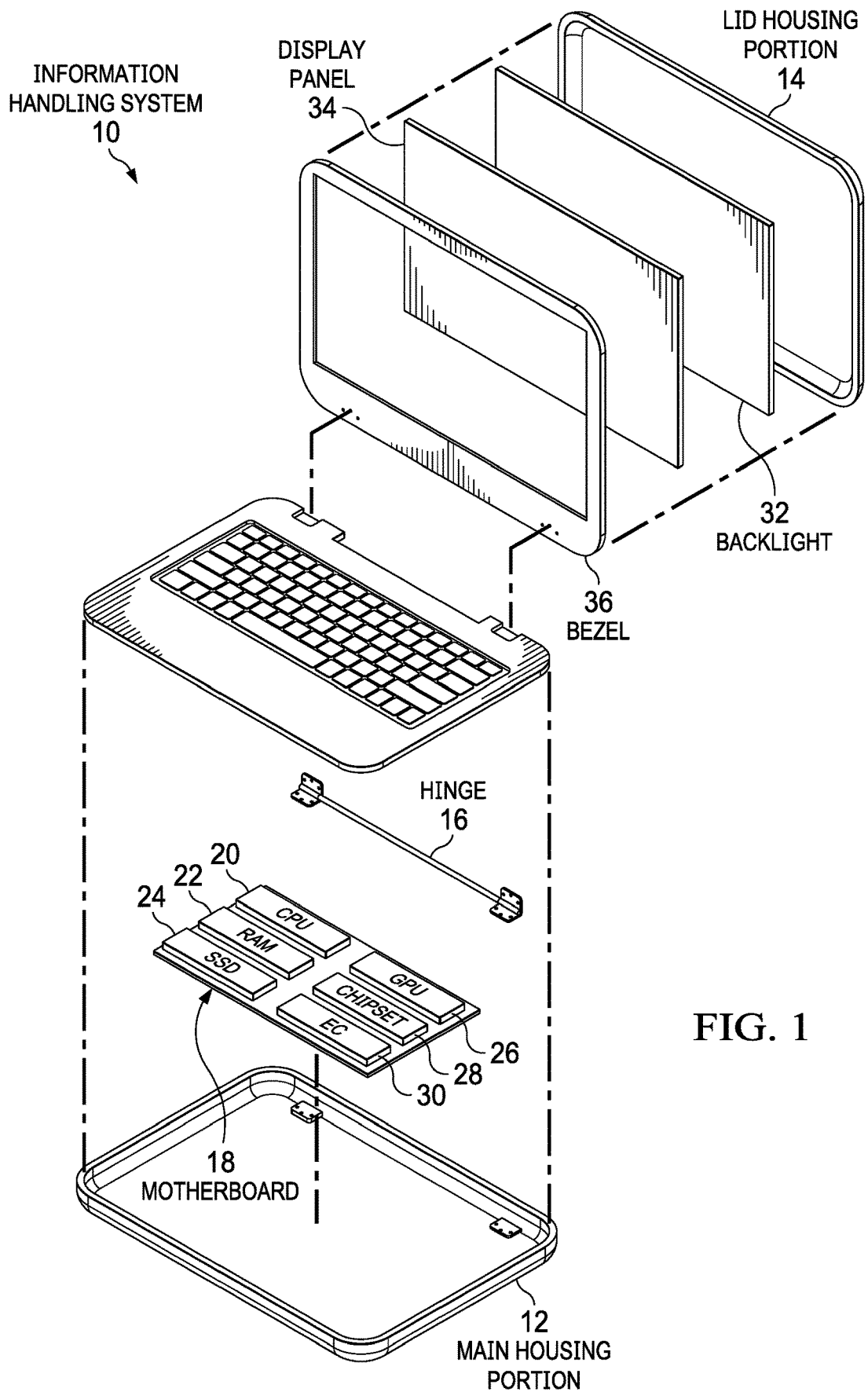
FIG. 1 depicts an exploded view of an information handling system having a high color gamut spectrum backlight.

Referring now to FIG. 1, an exploded view depicts an information handling system 10 having a high color gamut spectrum backlight 32. In the example embodiment, information handling system 10 has a portable main housing portion 12 rotationally coupled to a lid housing portion 14 by a hinge 16 and configured to hold processing components that process information. In alternative embodiments, the high color gamut spectrum backlight 32 may support other types of information handling systems, such as desktops, tablets and all-in-one systems, and/or peripheral display devices, such as computer monitors or televisions. Main housing portion 12 holds processing components that couple to and communicate through a motherboard 18. A central processing unit (CPU) 20 executes instructions to process information in cooperation with a random access memory (RAM) 22 that stores the instructions and information. A solid state device (SSD) 24 or other persistent memory device stores information, such as an operating system and applications, during low power conditions for retrieval by CPU 20 to RAM 22. A graphics processor unit (GPU) 26 further processes information to define visual images for presentation at a display, such as by defining an array of pixel values that define colors presented at pixels of a display resolution. A chipset 28 supports operation of CPU 20, such as clock speeds and power states. An embedded controller 30 manages power for the processing components and interactions with input/output devices, such as a keyboard. In various alternative embodiments, a variety of arrangements of these and other processing components may be used to process information.

In the example embodiment, lid housing portion 14 supports a liquid crystal display (LCD) panel 34 that generates visual images with an array of liquid crystal pixels illuminated by a backlight 32 and secured in place by a bezel 36. For example, GPU 26 communicates pixel values to display panel 34 that set the liquid crystal state for red, green and blue liquid crystal elements in each pixel. The liquid crystal state for each color element determines how much of that color passes through the pixel so that a color is generated. Backlight 32 includes an illumination device that generates a high color gamut spectrum of illumination and distributes the illumination evenly across display panel 34. By generating backlight with red, green and blue spectrum aligned to the pixel values, a high quality image is generated as the illumination passes through display panel 34. Although the example embodiment depicts an LCD panel, in alternative embodiments other types of panels that support image generation with a backlight may be used.

Figure 2:
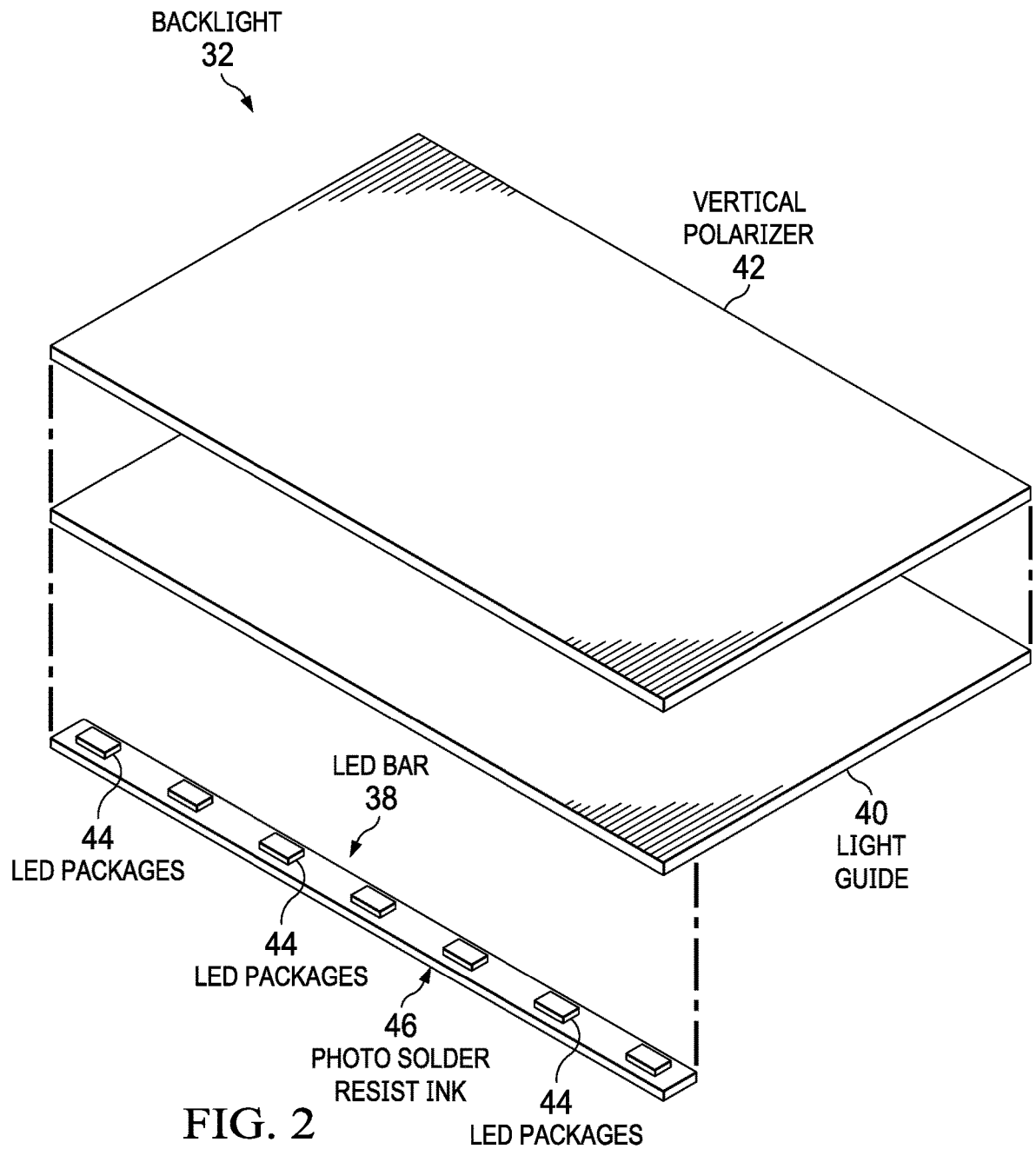
FIG. 2 depicts an exploded view of a high color gamut spectrum backlight.

Referring now to FIG. 2, an exploded view depicts a high color gamut spectrum backlight 32. In the example embodiment, an LED bar 38 formed from a flexible printed circuit board couples to a light guide 40 that evenly distributes the illumination, which passes through a vertical polarizer 42 to condition the illumination for passing through the LCD display panel. LED bar 38 has a flexible printed circuit board to support and power LED packages 44, which are distributed in a linear configuration. A photoresist ink 46 is disposed over the flexible printed circuit board to aid in illumination generation, as described in greater detail below. Although the example embodiment depicts a single linear configuration of LED packages, in alternative embodiments, various other types of distributions may be used to obtain an even distribution of illumination out of light guide 40.

Figure 3A:
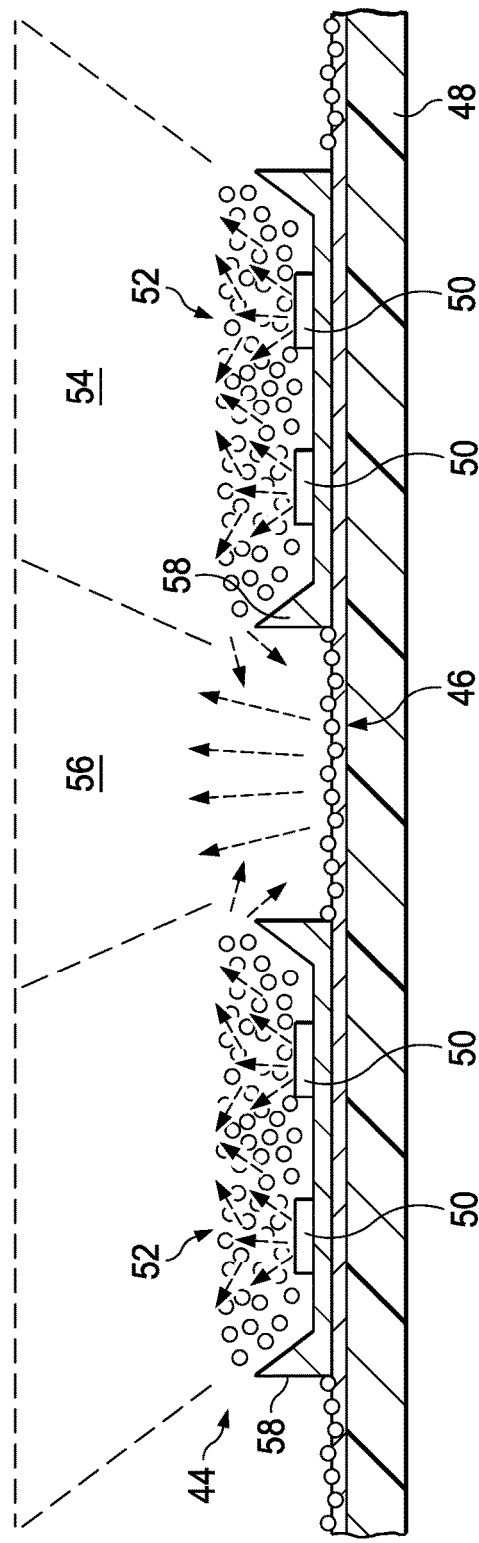
FIGS. 3A and 3B depicts a side cutaway view of an LED bar having plural LED packages that cooperate with a passive light source disposed on a circuit board.
Figure 3B:
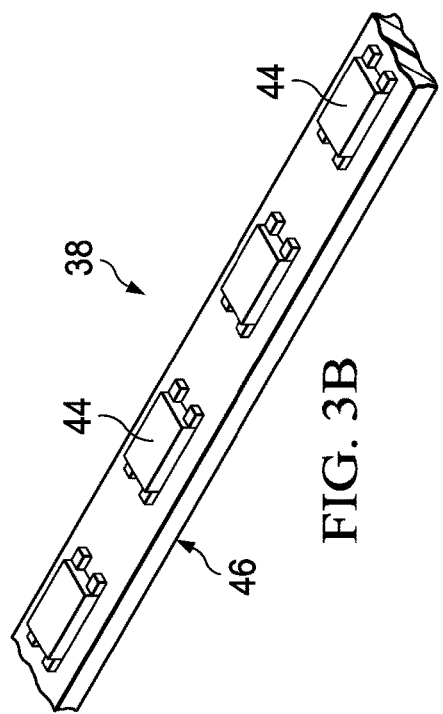

Referring now to FIGS. 3A and 3B, a side cutaway view depicts an LED bar 38 having plural LED packages 44 that cooperate with a passive light source disposed on a printed circuit board 48. In the example embodiment, the active light source for generating illumination is a blue LED integrated circuit 50 that is supported in LED package 44 and generates illumination with power provided through LED array bar printed circuit board (PCB) 48. A package mold 58 forms an interior in which first and second blue LED integrated circuits 50 are coupled to the package floor and enclosed in a silicon material 52 infused with narrow FWHM red phosphor material, such as KSF, that produces a narrow full width at half maximum (FWHM) illumination when excited by blue light of blue LED integrated circuit 50. As a result, red/blue light 54 is generated by application of power to blue LED integrated circuit 50 and excitement of red phosphor within silicon filling material 52. Package mold 58 forms the interior with sidewalls that have a height of less than the height of silicon filling material 52 so that red/blue light 54 is directed by refraction and other properties to illuminate at the upper surface of LED array bar PCB 48, which is coated by a photoresist ink 46 infused with a green quantum dot material. Illumination of the green quantum dot material of photoresist ink 46 results in excitation that generates a green light 56. In the example embodiment, red light is generated by a passive red phosphor integrated in silicon filling material 52, however, in alternative embodiments, other passive red light generation material may be used, such as red quantum dots, and the red passive material may be included in the photoresist ink on the circuit board instead of in the silicon filling material. Similarly, in the example embodiment green light is generated by a passive green quantum dot material included on the circuit board, however, in alternative embodiments other passive green light generation material may be used, such as green phosphor, and the green material may be included in silicon filling material 52 instead of on the circuit board.

Figure 4:
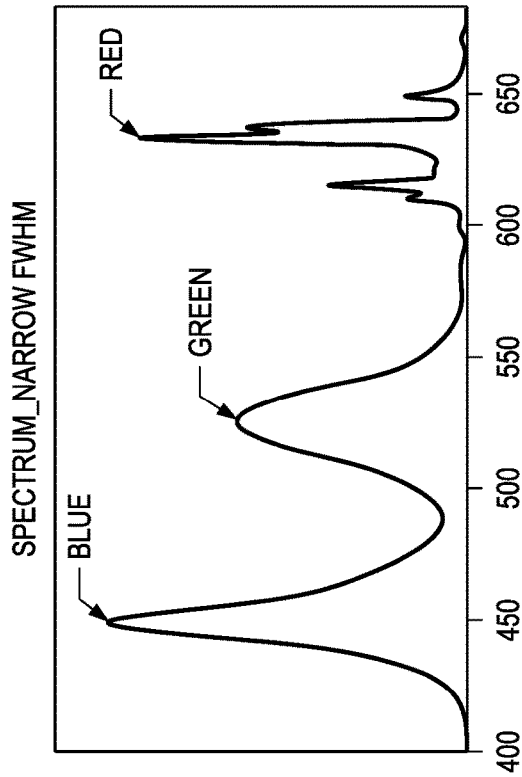
FIG. 4 depicts a high color gamut spectrum provided by the LED bar.

Referring now to FIG. 4, a high color gamut spectrum provided by the LED bar is depicted. As illustrated, the active blue LED generates green and red illumination from the passive materials to produce high color gamut spectrum light targeted at the red, green and blue light wavelengths filtered by pixels of the LCD panel. In alternative embodiments, the red or green illumination may be generated by an active light source while the blue illumination is generated by a passive material.

Figure 5A:
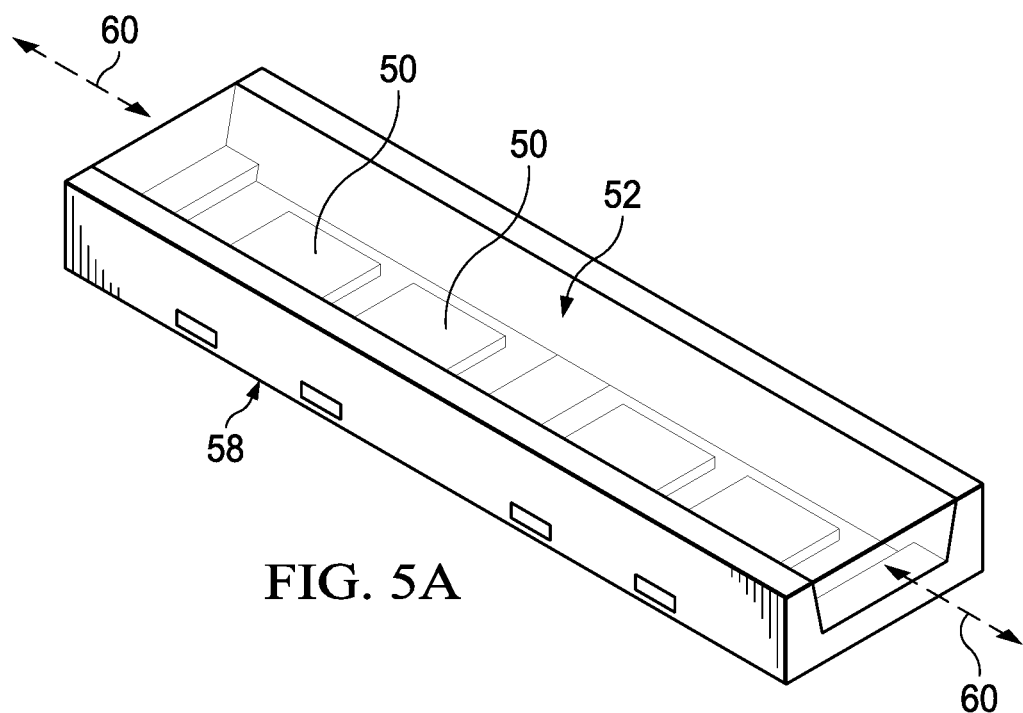
FIGS. 5A, 5B and 5C depict a side perspective view of an LED package configured to illuminate a passive light source disposed on a circuit board.
Figure 5B:
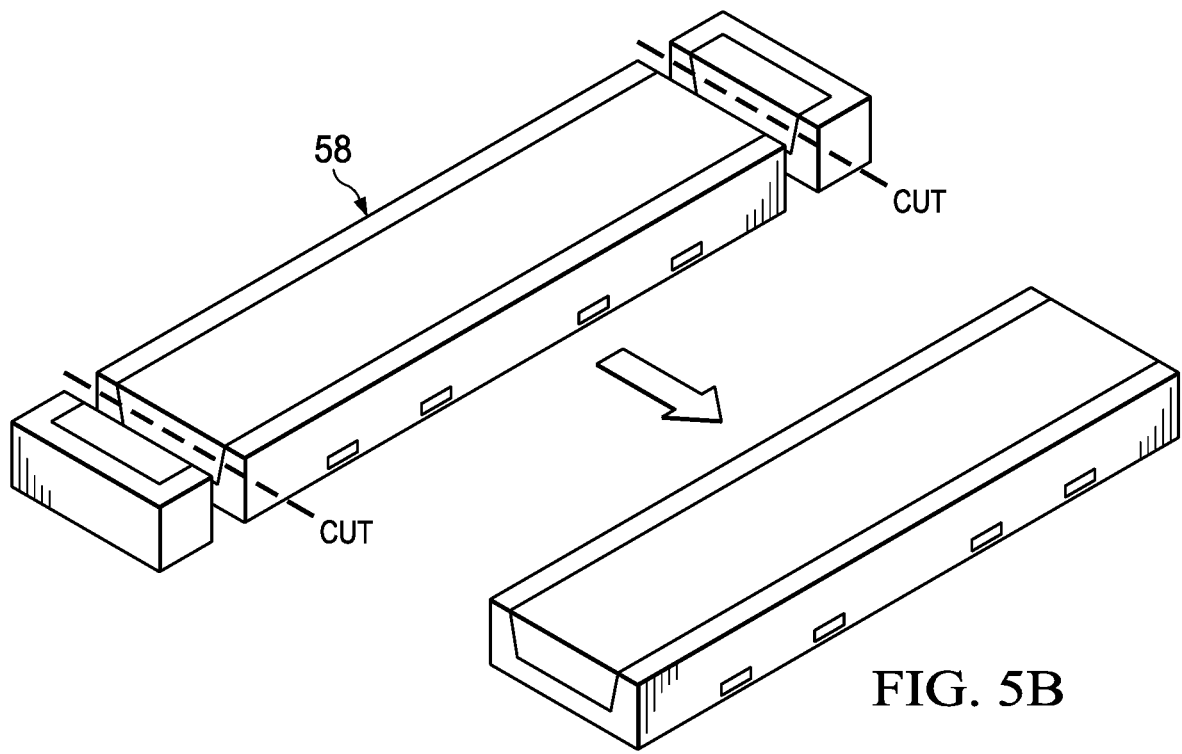
Figure 5C:
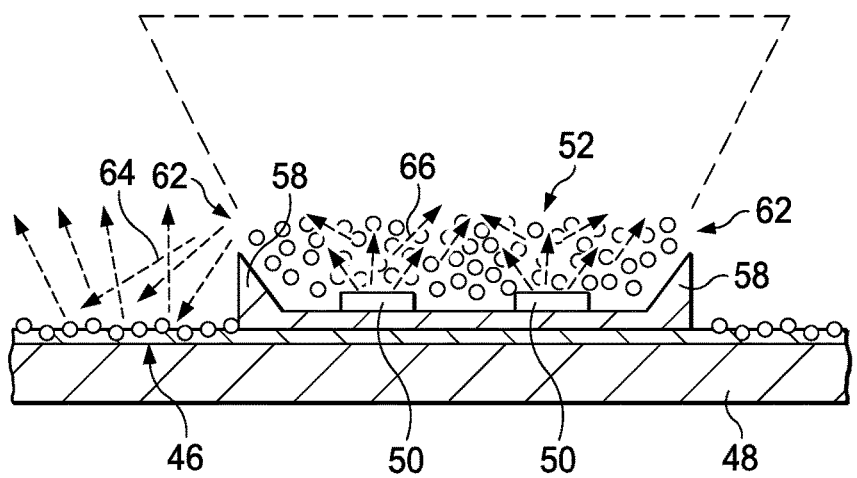

Referring now to FIGS. 5A, 5B and 5C, a side perspective view depicts an LED package 58 configured to illuminate a passive light source disposed on a circuit board that couples to and supports the bottom surface of LED package 58. In the example embodiment, four blue LED integrated circuits 50 are disposed in the interior of package 58 to generate blue light that excites red phosphor integrated with silicon filling material that fills the interior. Opposing ends of LED package 58 form an opened edge window 60 in which the sidewall of package 58 opposing ends have a lower height than that of blue LED integrated circuits 50. Opened edge window 60 aids in directing illumination at green quantum dot material 46 disposed over the surface of circuit board 48. As illustrated by FIG. 5B, opened edge window 60 essentially cuts off the ends of a conventional LED package. In alternative embodiments, the height of sidewalls at the opposing ends may extend above blue LED integrated circuits 50 while having silicon filling material 52 extend over the top of the sidewall. For instance, reduced sidewall height provides an overhang 62 of silicon material that directs light dispersed as shown by arrows 66 within silicon material 52 to exit towards green quantum dot material 46 as indicated by arrows 64. The height configuration of package 58 sidewalls may vary to adjust light distribution based upon blue light intensity and the amount of red and green passive illumination material so that desired balance of red, green and blue light is provided.

Figure 6:
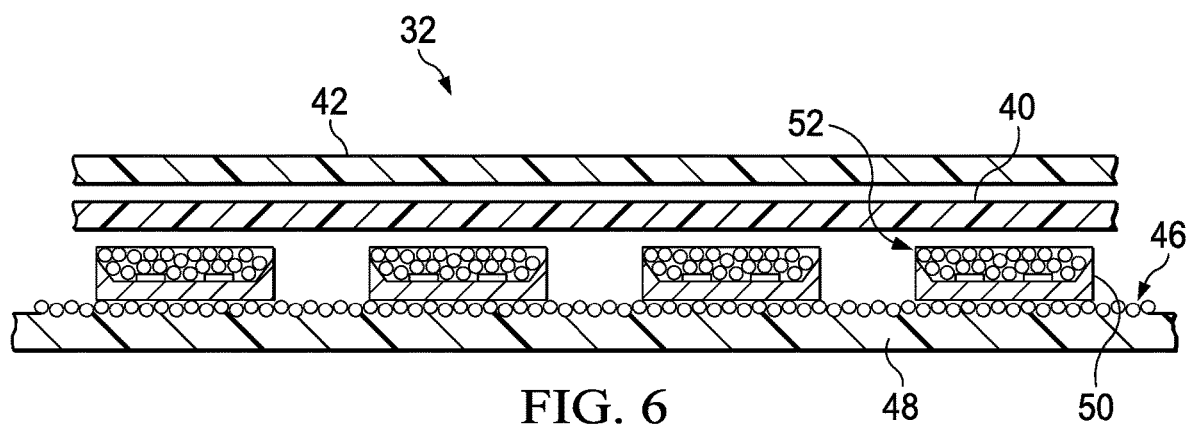
FIG. 6 depicts a side cutaway view of a backlight that includes a high color gamut spectrum LED illumination device.

Referring now to FIG. 6, a side cutaway view depicts a backlight 32 that includes a high color gamut spectrum LED illumination device. LED printed circuit board 48 has green quantum dot material 46 exposed to blue/red illumination from red phosphor infused LED packages 58 disposed in a linear configuration. The illumination provided by the active blue LED and passive red and green material is a high color gamut spectrum illumination that feeds into a light guide 40 for distribution across an LCD panel. The resulting illumination proceeds through an optical film 42 without additional color treatments. For example, conventional high color gamut spectrum backlights would produce a blue illumination to pass through a color film included in the optical film. Generating illumination with red green and blue light at LED printed circuit board 48 without an overlying film provides a more robust and reliable light source that is less complex to manufacture and integrate into systems.

Although the present invention has been described in detail, it should be understood that various changes, substitutions and alterations can be made hereto without departing from the spirit and scope of the invention as defined by the appended claims.

What is claimed is:

1. An information handling system comprising:
a housing;
a processor disposed in the housing and operable to execute instructions that process information;
a memory disposed in the housing and interfaced with the processor to store the instructions and information;
a display panel integrated in the housing and interfaced with the processor to present the information as visual images; and
a backlight disposed at the display panel to illuminate the visual images, the backlight including plural light emitting diode packages coupled to a circuit board having a support surface, each light emitting diode packages including one or more light emitting diode integrated circuits, the light emitting diode integrated circuits having a first color illumination, each of the light emitting diode integrated circuits including a second color material disposed in a silicon filling material over each of the light emitting diode integrated circuits, and the circuit board having a third color illumination material disposed on the circuit board support surface.

2. The information handling system of claim 1 wherein:
the light emitting diode integrated circuits have only a blue color illumination;
the silicon filing material has only a red illumination; and
the third color illumination material has only a green illumination.

3. The information handling system of claim 2 wherein the third color illumination material comprises green quantum dots integrated with a photo resist ink disposed over the circuit board.

4. The information handling system of claim 2 wherein the silicon filing material comprises a red phosphor.

5. The information handling system of claim 1 wherein:
each of the plural light emitting diode packages encloses the one or more light emitting diode integrated circuits and the silicon filing material in a housing coupled to the circuit board and having an open upper surface; and
the silicon filling material extends out of the opening at a greater height over the circuit board than the housing so that illumination from the silicon filling material is directed towards the third color illumination material.

6. The information handling system of claim 5 wherein the one or more light emitting diode integrated circuits comprise plural light emitting diode integrated circuits having a linear configuration between opposing ends of the housing.

7. The information handling system of claim 6 wherein the housing at both opposing ends has a height of less than a height of the plural light emitting diodes.

8. The information handling system of claim 1 wherein the backlight further comprises a linear circuit board having the light emitting diode packages in a linear configuration and a light guide configured to accept illumination from the linear circuit board for distribution at the display.

9. The information handling system of claim 8 wherein the display comprises a liquid crystal display panel.

10. A method for generating illumination, the method comprising:
generating blue light with a blue light emitting diode disposed in a package and coupled to a circuit board;
generating red light with a passive red material disposed in silicon filling material, the silicon filling material disposed in the package, the passive red material energized by the blue light to illuminate red light; and
generating green light with a passive green material disposed on the circuit board outside the package, passive green material energized by the blue light to illuminate green light.

11. The method of claim 10 further comprising:
forming the package to have at least a part of a sidewall with a height not greater than a height of the blue light emitting diode relative to the circuit board; and
illuminating the passive green material through the at least part of a sidewall.

12. The method of claim 11 wherein the passive green material comprises quantum dot material.

13. The method of claim 12 wherein the passive red material comprises red phosphor.

14. The method of claim 13 further comprising:
coupling plural of the packages on the circuit board in a linear configuration; and
coupling the circuit board to a planar light guide to distribute the illumination.

15. The method of claim 14 further comprising:
coupling the light guide to a liquid crystal display panel; and
directing the illumination from the light guide through the liquid crystal panel.

16. The method of claim 15 further comprising:
disposing a photoresist ink over the circuit board; and
coupling the quantum material to the photoresist ink.

17. An illumination device comprising:
a circuit board;
a package having plural sidewalls defining an interior and an opening, the package coupled to the circuit board;
a blue light emitting diode integrated circuit coupled to the package in the interior;
a filling material disposed in the package interior and integrating red phosphor material operable to illuminate red light when energized by the blue light emitting diode integrated circuit; and
a green quantum dot material disposed on the circuit board external to the package.

18. The illumination device of claim 17 further comprising:
a photoresist ink disposed on the circuit board;
wherein the green quantum dot material integrates in the photoresist ink.

19. The illumination device of claim 17 wherein the opening forms with at least one of the plural sidewalls having a height of less than a height of the blue light emitting diode relative to the circuit board.

20. The illumination device of claim 19 further comprising plural of the packages disposed in a linear configuration on the circuit board.

* * * * *